United States Patent
Chen

(10) Patent No.: US 8,446,758 B2
(45) Date of Patent: May 21, 2013

(54) VARIABLE RESISTANCE MEMORY PROGRAMMING

(75) Inventor: Xiaonan Chen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 121 days.

(21) Appl. No.: 12/967,592

(22) Filed: Dec. 14, 2010

(65) Prior Publication Data

US 2012/0147667 A1    Jun. 14, 2012

(51) Int. Cl.
*G11C 11/00*    (2006.01)

(52) U.S. Cl.
USPC .......................................... 365/163; 364/148

(58) Field of Classification Search .................. 365/163
See application file for complete search history.

(56) References Cited

U.S. PATENT DOCUMENTS

| | | | |
|---|---|---|---|
| 6,914,801 B2 | 7/2005 | Kostylev et al. | |
| 6,930,909 B2 | 8/2005 | Moore et al. | |
| 7,272,037 B2 * | 9/2007 | Lee et al. | 365/163 |
| 7,327,602 B2 * | 2/2008 | Kostylev et al. | 365/163 |
| 7,660,147 B2 * | 2/2010 | Chao et al. | 365/148 |
| 7,929,336 B2 * | 4/2011 | Philipp et al. | 365/163 |
| 7,978,508 B2 * | 7/2011 | Czubatyj | 365/163 |
| 8,036,014 B2 * | 10/2011 | Lee et al. | 365/148 |
| 8,102,702 B2 * | 1/2012 | Chen | 365/163 |
| 2007/0008769 A1 * | 1/2007 | Kim et al. | 365/148 |
| 2008/0316804 A1 | 12/2008 | Jeong et al. | |
| 2009/0244964 A1 | 10/2009 | Savransky et al. | |
| 2009/0323409 A1 | 12/2009 | Lin et al. | |
| 2010/0182826 A1 | 7/2010 | Czubatyj | |
| 2010/0226168 A1 * | 9/2010 | Savransky | 365/163 |
| 2010/0314601 A1 * | 12/2010 | Lee | 257/4 |
| 2011/0317480 A1 * | 12/2011 | Lung et al. | 365/163 |

OTHER PUBLICATIONS

Ielmini, Daniele, et al., "Recovery and Drift Dynamics of Resistance and Threshold Voltages in Phase-Change Memories", Electron Devices, IEEE Transactions, (Apr. 14, 2007), 308-315.

Kau, Derchang, et al., "A Stackable Cross Point Phase Change Memory", Electron Devices, IEEE Transactions, (Mar. 29, 2010), 4 pgs.

* cited by examiner

*Primary Examiner* — Son Mai
(74) *Attorney, Agent, or Firm* — Schwegman, Lundberg & Woessner, P.A.

(57) ABSTRACT

Some embodiments include a device having memory elements and methods of storing information into the memory elements. Such methods can include increasing a temperature of a portion of a memory element for a time interval during an operation to change a resistance state of the memory element. After the time interval, the methods can include decreasing the temperature of the portion of the memory element. Decreasing the temperature can be performed using a signal having a first negative slope and a second negative slope. Other embodiments are described.

33 Claims, 10 Drawing Sheets

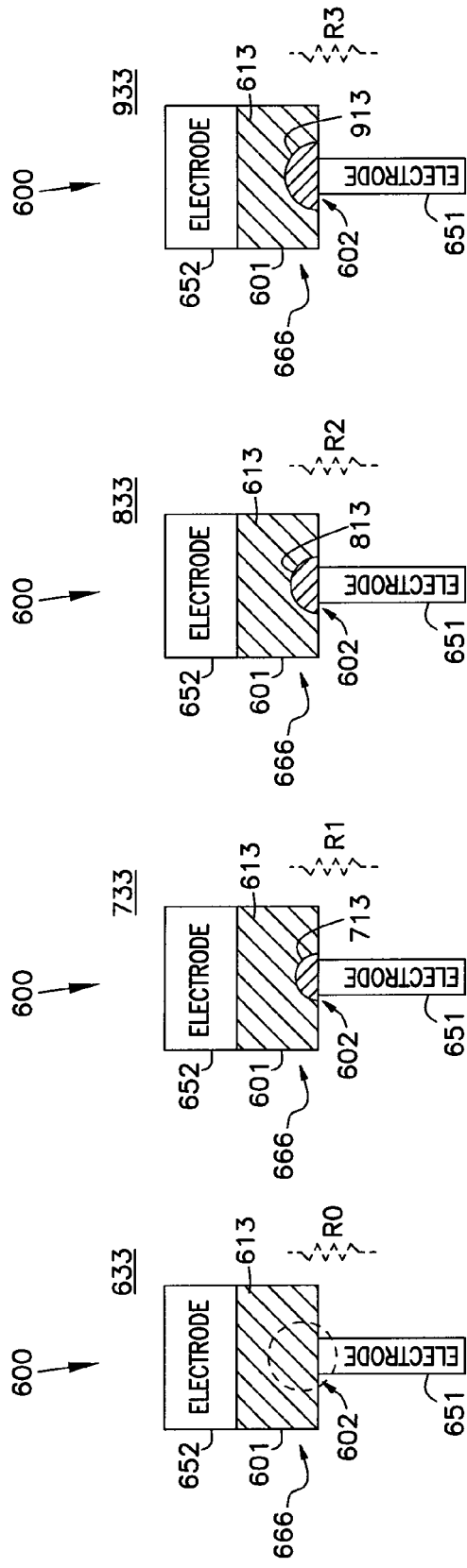

1000

| RESISTANCE VALUE | INFORMATION VALUE |
|---|---|
| R0 | 00 |
| R1 | 01 |
| R2 | 10 |
| R3 | 11 |

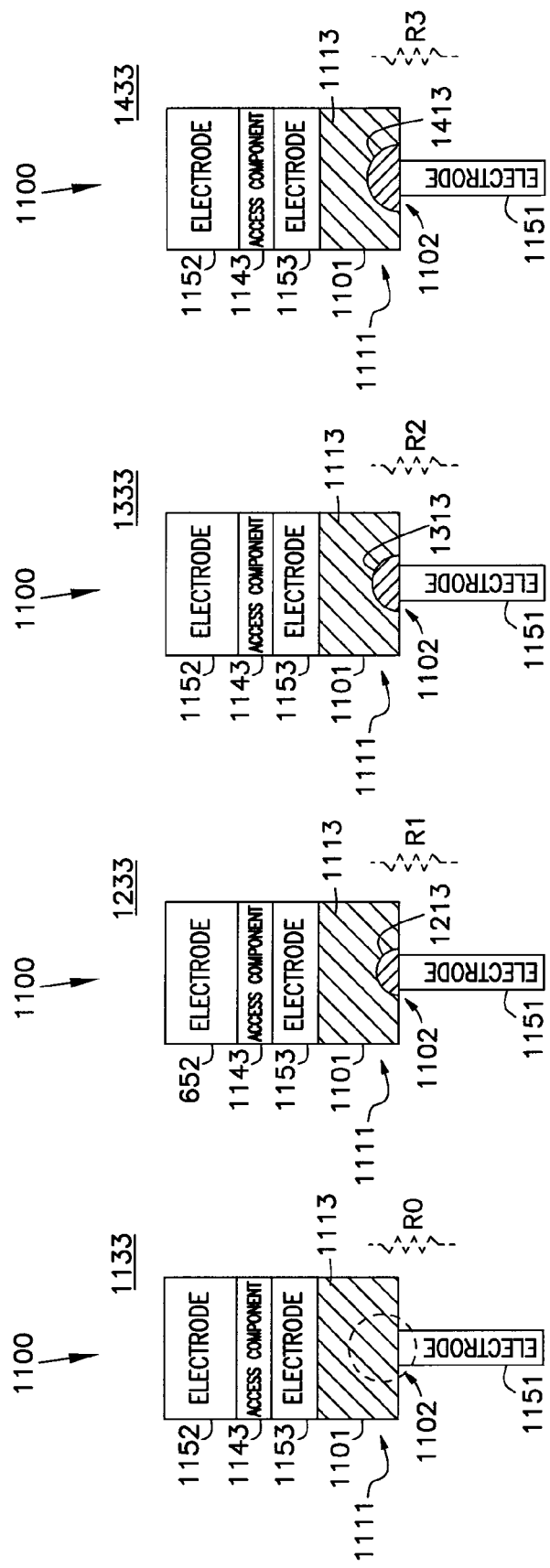

VARIABLE RESISTANCE MEMORY PROGRAMMING

BACKGROUND

Computers and other electronic products (e.g., digital televisions, digital cameras, and cellular phones) often have memory devices with memory cells to store information. Some memory devices may store information having a value based on a resistance value of a memory element of the memory cell. The resistance value in the memory element of these memory devices may change over time. Thus, the reliability of the information stored in the memory cell may be degraded.

BRIEF DESCRIPTION OF THE DRAWINGS

FIG. 6 through FIG. 9 show a memory cell having a memory element configured to have various resistance states corresponding to various resistance values, according to various embodiments of the invention.

FIG. 11 through FIG. 14 show a memory cell having a memory element and an access component arranged in a stack, according to various embodiments of the invention.

DETAILED DESCRIPTION

Figure 1:
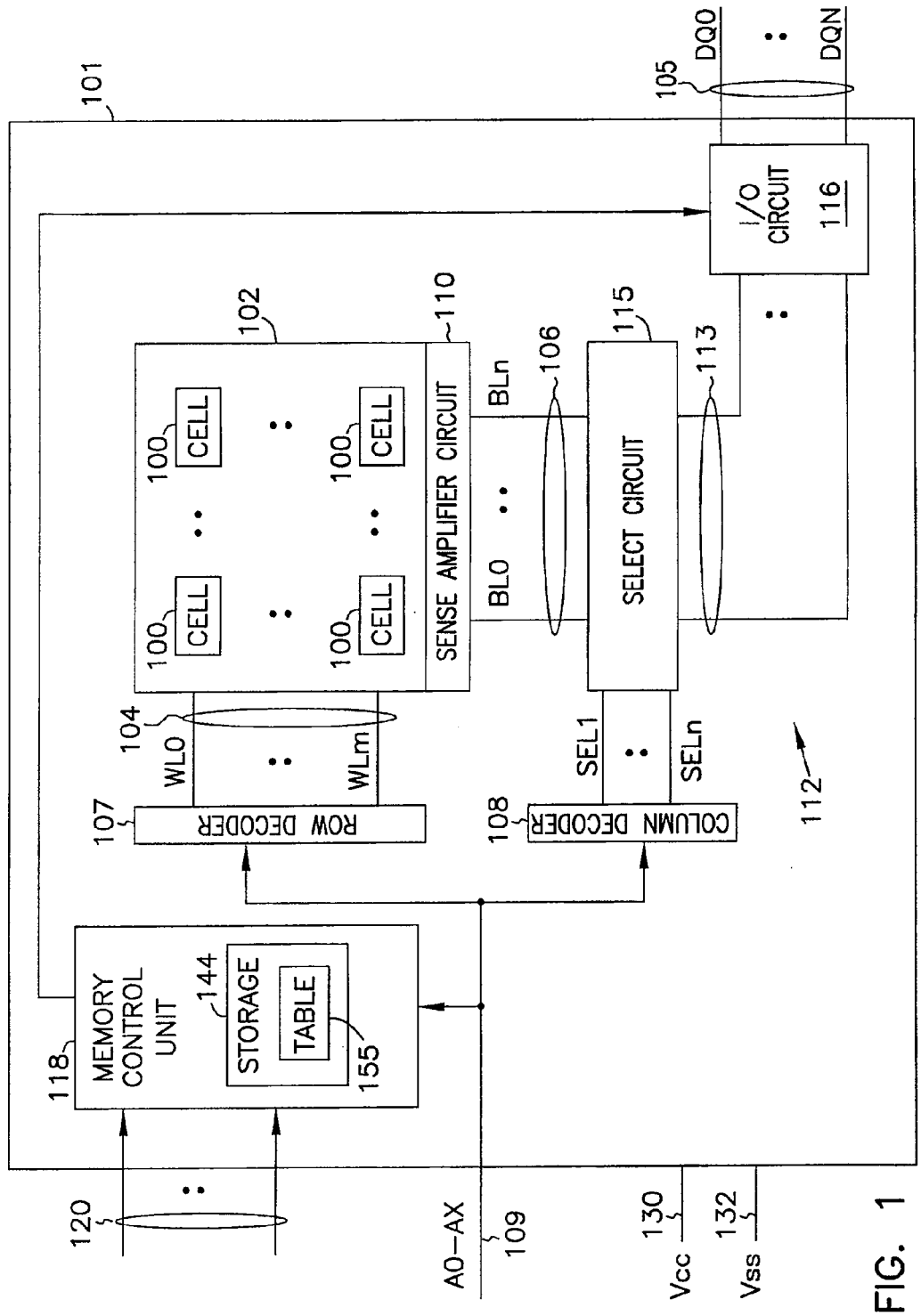
FIG. 1 shows a block diagram of a memory device having a memory array with memory cells, according to an embodiment of the invention.

FIG. 1 shows a block diagram of a memory device 101 having a memory array 102 with memory cells 100, according to an embodiment of the invention. Memory cells 100 can be arranged in rows and columns along with lines 104 (e.g., wordlines having signals WL0 through WLm) and lines 106 (e.g., bit lines having signals BL0 through BLn). Memory device 101 can use lines 104 and lines 106 to transfer information with memory cells 100. Row decoder 107 and column decoder 108 decode address signals A0 through AX on lines 109 (e.g., address lines) to determine which memory cells 100 are to be accessed. A sense amplifier circuit 110 operates to determine the value of information read from memory cells 100 and provide the information in the form of signals to lines 106. Sense amplifier circuit 110 can also use the signals on lines 106 to determine the value of information to be written to memory cells 100. Memory device 101 includes circuitry 112 to transfer information between memory array 102 and lines (e.g., data lines) 105. Signals DQ0 through DQN on lines 105 can represent information read from or written into memory cells 100. Lines 105 can include nodes within memory device 101 or pins (or solder balls) on a package where memory device 101 can reside. Other devices external to memory device 101 (e.g., a memory controller or a processor) can communicate with memory device 101 through lines 105, 109, and 120.

Memory device 101 can perform memory operations such as a read operation to read information from memory cells 100 and a programming operation (sometime referred to as write operation) to program (e.g., write) information into memory cells 100. A memory control unit 118 controls the memory operations based on control signals on lines 120. Examples of the control signals on lines 120 can include one or more clock signals and other signals to indicate which operation (e.g., a programming or read operation) memory device 101 can perform. Other devices external to memory device 101 (e.g., a processor or a memory controller) can control the values of the control signals on lines 120. Specific values of a combination of the signals on lines 120 can produce a command (e.g., programming or read command) that can cause memory device 101 to perform a corresponding memory operation (e.g., programming or read operation).

Each of memory cells 100 can be programmed to store information representing a value of a single bit or a value of multiple bits such as two, three, four, or another number of bits. For example, each of memory cells 100 can be programmed to store information representing a binary value "0" or "1" of a single bit. The single bit per cell is sometimes called a single level cell. In another example, each of memory cells 100 can be programmed to store information representing a value of multiple bits, such as one of four possible values "00", "01", "10", and "11" of two bits, one of eight possible values "000", "001", "010", "011", "100", "101", "110" and "111", or one of other values of another number of multiple bits. The multiple bit per cell is sometimes called a multilevel cell.

Memory device 101 can receive a supply voltage, including supply voltage signals Vcc and Vss, on lines 130 and 132, respectively. Supply voltage signal Vss can operate at a ground potential (e.g., having a value of approximately zero volts). Supply voltage signal Vcc can include an external voltage supplied to memory device 101 from an external power source such as a battery or an alternating-current to direct-current (AC-DC) converter circuitry.

Circuitry 112 of memory device 101 can include a select circuit 115 and an input/output (I/O) circuit 116. Select circuit 115 can respond to signals SEL1 through SELn to select the signals on lines 106 and 113 that can represent the information read from or programmed into memory cells 100. Column decoder 108 can selectively activate the SEL1 through SELn signals based on the A0 through AX address signals on lines 109. Select circuit 115 can select the signals on lines 106 and 113 to provide communication between memory array 102 and I/O circuit 116 during read and programming operations.

Memory device 101 can include a non-volatile memory device and memory cells 100 can include non-volatile memory cells such that memory cells 100 can retain information stored thereon when power (e.g., Vcc, Vss, or both) is disconnected from memory device 101. Each of memory cells 100 can include a memory element having a material in which at least a portion (e.g., a programmable portion) of the material can be programmed to cause the portion to change between different phases, such as between a crystalline phase (which is sometimes referred to as a crystalline state) and an amorphous phase (which is sometimes referred to as an amorphous state). Each of memory cells 100 can have a resistance state corresponding to a resistance value when the memory cell is programmed. Different resistance values can represent different values of information programmed in each of memory cells 100.

Memory device 101 can perform a programming operation when it receives (e.g., from an external processor or a memory controller) a programming command and value of information to be programmed into one or more selected memory cells among memory cells 100. Based on the value of the information, memory device 101 can program the selected memory cells to cause them to have appropriate resistance values to represent the values of the information.

Memory device 101 can include a storage area 144 to store programming parameter values and selectively use these values during a programming operation. Memory device 101 can store the programming parameter values (e.g., in the form of a table 155 in storage area 144). The programming parameter values can include different amplitude values of electrical pulses of signals used during a programming operation. The amplitude values can correspond to voltage amplitude values (e.g., in volt units) or current amplitude values (e.g., in ampere units) of one pulse or multiple pulses to be used in a programming operation. The programming parameter values can also include values for time intervals associated with pulse segments of the pulses of the signals. The values for the time intervals can include a rise time value (in time unit such as nanosecond) and fall time value of the pulse segments of a pulse.

One skilled in the art may recognize that memory device 101 may include other components that are not shown to help focus on the embodiments described herein.

Memory device 101 may include devices, memory cells, and programming operations similar to or identical to those described below with reference to FIG. 2 through FIG. 20.

Figure 2:
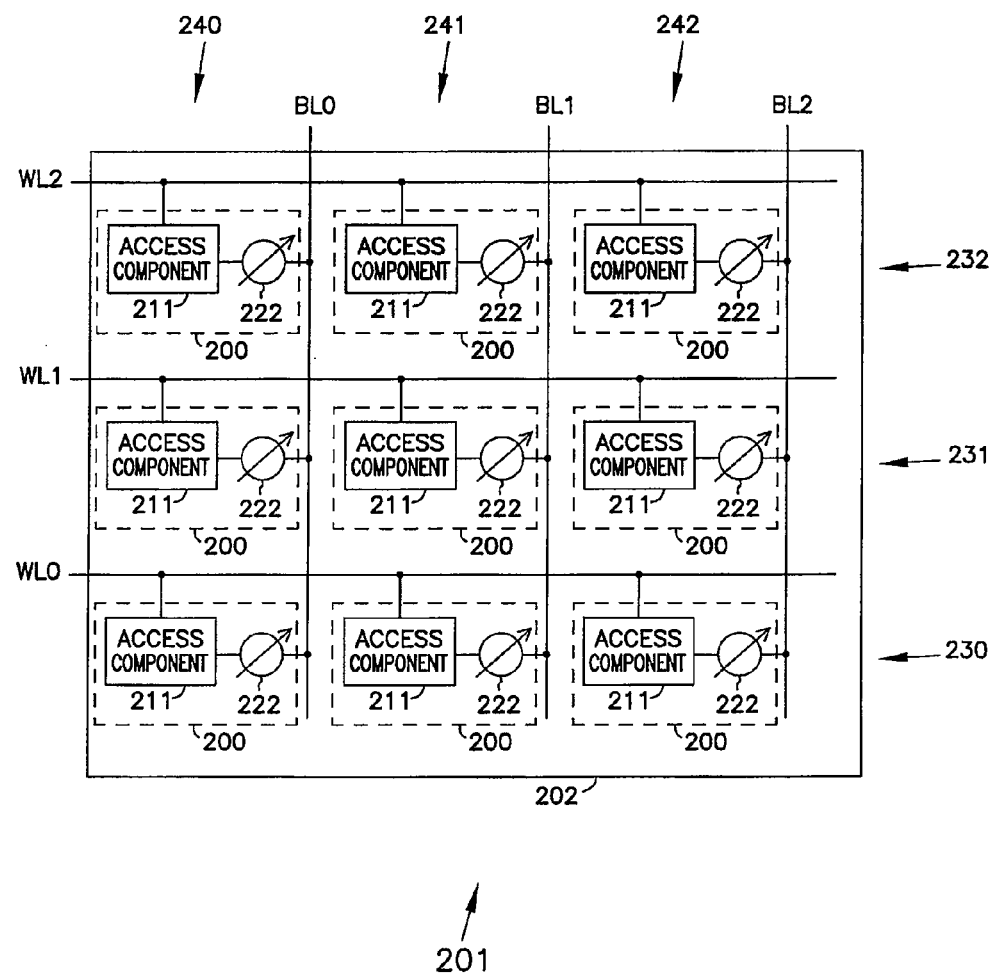
FIG. 2 show a partial block diagram of a memory device having a memory array including phase change memory cells with access components and memory elements, according to an embodiment of the invention.

FIG. 2 shows a partial block diagram of a memory device 201 having a memory array 202 including phase change memory cells 200 with access components 211 and memory elements 222, according to an embodiment of the invention. Memory array 202 can correspond to memory array 102 of FIG. 1. As shown in FIG. 2, memory cells 200 can be arranged in rows 230, 231, and 232 along with lines (which can conduct signals such as signals WL0, WL1, and WL2) and columns 240, 241, and 242 along with lines (which can conduct signals such as signals BL0, BL1, and BL2). Access components 211 can turn on (e.g., by using appropriate values of signals WL0, WL1, and WL2) to allow access to memory elements 222 to read information from or program (e.g., write) information into memory elements 222. Programming information into memory elements 222 can include causing the memory elements to have specific target resistance value. Read information from memory elements 222 can include measuring a resistance value of memory elements 222.

Figure 3:
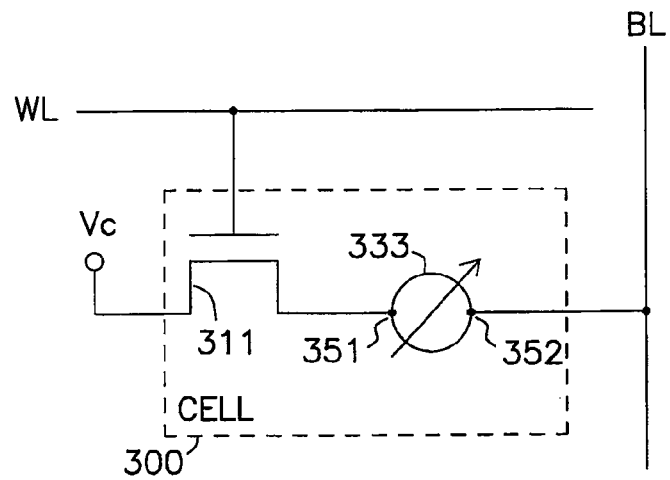
FIG. 3 through FIG. 5 show schematic diagrams of examples of different memory cells having different access components coupled to memory elements, according to various embodiments of the invention.
Figure 4:
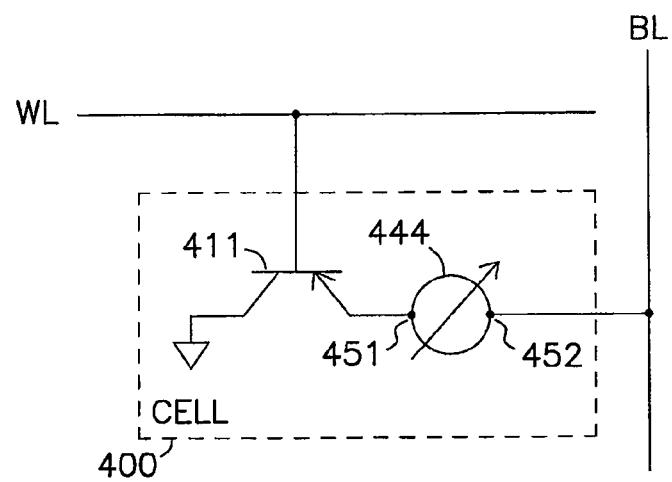
Figure 5:
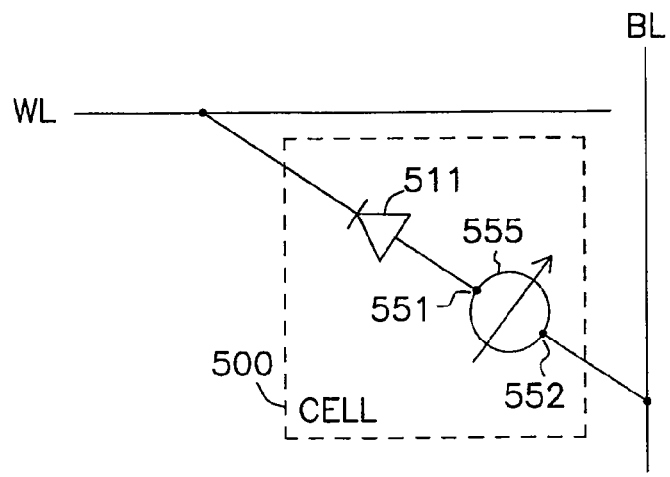

FIG. 3 through FIG. 5 show schematic diagrams of examples of different memory cells 300, 400, and 500 having different access components 311, 411, and 511 coupled to memory elements 333, 444, and 555, according to various embodiments of the invention. Lines (which can conduct signals such as signals WL and BL) in FIG. 3 through FIG. 5 can correspond to one of lines 104 and one of lines 106 of FIG. 1, respectively. FIG. 3 through FIG. 5 show examples of access components 311, 411, and 511 including a metal-oxide-semiconductor field-effect transistor (MOSFET), a bipolar junction transistor (BJT), and a diode, respectively. Memory cells 300, 400, and 500 can include other types of access components.

As shown in FIG. 3 through FIG. 5, each of memory elements 333, 444, and 555 can couple between two electrodes, such as electrodes 351 and 352 (FIG. 3), electrodes 451 and 452 (FIG. 4), or electrodes 551 and 552 (FIG. 5). FIG. 3 through FIG. 5 schematically show electrodes 351, 352, 451, 452, 551, and 552 as dots. Structurally, each of these electrodes can include a conductive material, and the memory element (333, 444, or 555) can include a variable resistance material. The variable resistance material can include a phase change material. As shown in FIG. 3 through FIG. 5, access components 311, 411, and 511 can enable signals (e.g., voltage or current) to be transferred to and from memory elements 333, 444, and 555 via electrodes 351, 352, 451, 452, 551, and 552 during operations, such as read and programming operations.

Each memory cell 200 can have an on-state and an off-state. A programming operation may be performed in the on-state to write information into the memory cell. A read operation may be performed in the off-state to read information from the memory cell.

For example, a programming operation may use signal WL to turn on access components 311, 411, and 511, and then apply a voltage or a current (e.g., programming voltage or current) through memory elements 333, 444, and 555. The voltage or current can cause at least a portion of the material of memory elements 333, 444, and 555 to heat and melt. After the material reaches some temperature (e.g., melting point temperature of the material), the programming operation may allow the material to cool in a controlled manner, such as by controlling the amplitude and time interval of a pulse of signal WL used during the programming. These heating and cooling actions may change the phase of the material, such as from a crystalline phase before the programming operation to an amorphous phase after the programming operation. The phase change can be reversible (e.g., changing from an amorphous phase to a crystalline phase). Different phases of the material may cause memory elements 333, 444, and 555 to have different resistance states with different resistance values, which can correspond to different values of the information that is being stored in memory elements 333, 444, and 555.

A read operation may use signal WL to turn on access components 311, 411, and 511, and then apply a voltage or a current (e.g., read voltage or current) through memory elements 333, 444, and 555. The read operation may measure the resistance of memory cells 300, 400, and 500 based on a read voltage or current to determine the corresponding value of information stored therein. For example, in each of memory cells 300, 400, and 500, a different resistance value can provide a different value (e.g., voltage or current value) on signal BL when a read voltage or current passes through memory elements 333, 444, and 555. Other circuitry of the memory device (e.g., a circuit such as I/O circuit 116 of FIG. 1) can use signal BL to measure the resistance value of memory elements 333, 444, and 555 to determine the value of the information.

The voltage or current used during a read operation can have a value different from the voltage or current used during a programming operation. For example, in a programming operation in the on-state of the memory cell, the value of the signal (e.g., signals from line BL in FIG. 3 or FIG. 4 or from line WL in FIG. 5) that creates a current flowing through the memory element can be sufficient enough to cause the material of at least a portion of the memory element to change between different phases. The change in phases can alter the resistance value of the memory element to reflect the value of the information to be stored in memory elements 333, 444, and 555.

In a read operation in the off-state of the memory cell, the value of the signal (e.g., signals from line BL in FIG. 3 or FIG. 4 or from line WL in FIG. 5) that creates a current flowing through the memory element can be sufficient to create the current but insufficient to cause any portion of the memory element to change between different phases. Thus, the value of the information stored in the memory element can remain unchanged during and after the read operation.

Memory cells 100, 200, 300, 400, and 500 of FIG. 1 through FIG. 5 can include a memory cell having a structure similar to or identical to one or more of the memory cells described below with reference to FIG. 6 through FIG. 20.

FIG. 6 through FIG. 9 show a memory cell 600 having a memory element 666 configured to have various resistance states 633, 733, 833, and 933 corresponding to various resistance values R0, R1, R2, and R3, according to various embodiments of the invention. As shown in FIG. 6 through FIG. 9, memory cell 600 may include electrodes 651 and 652 coupled to memory element 666. Memory cell 600 may also include other components, such as an access component that may be similar to or identical to access component 211, 311, 411, or 511 (FIG. 2 through FIG. 5).

FIG. 6 through FIG. 9 omit the other components of memory cell 600 to help focus on the embodiments discussed herein. Further, for clarity in viewing FIG. 6 through FIG. 9, memory element 666 is shown with cross-section lines (shading lines), and electrodes 651 and 652 are shown without cross-section lines. Electrodes 651 and 652 may correspond to electrodes 351 and 352 (FIG. 3), electrodes 451 and 452 (FIG. 4), or electrodes 551 and 552 (FIG. 5), which are schematically shown as dots in FIG. 3 through FIG. 5. Electrode 651 in FIG. 6 through FIG. 9 can have a solid cylindrical shape.

Memory element 666 may include a variable resistance material that can be programmed to store information having a value based on the resistance value of the material after programming. The variable resistance material may include a phase change material that may be configured to change between multiple phases (e.g., between crystalline and amorphous phases). Some phase change materials may include chalcogenide materials with various combinations of germanium (Ge), antimony (Sb), tellurium (Te), and other similar materials. Examples of phase change materials may include binary combinations such as germanium telluride (GeTe), indium selenide (InSe), antimony telluride (SbTe), gallium antimonide (GaSb), indium antimonide (InSb), arsenic telluride (AsTe), and aluminum telluride (AlTe); ternary combinations such as germanium antimony telluride (GeSbTe), tellurium germanium arsenide (TeGeAs), indium antimony telluride (InSbTe), tellurium tin selenide (TeSnSe), germanium selenium gallide (GeSeGa), bismuth selenium antimonide (BiSeSb), gallium selenium telluride (GaSeTe), tin antimony telluride (SnSbTe), and indium antimony germanide (InSbGe); and quaternary combinations such as tellurium germanium antimony sulfide (TeGeSbS), tellurium germanium tin oxide (TeGeSnO), and alloys of tellurium germanium tin gold, palladium tellurium germanium tin, indium selenium titanium cobalt, germanium antimony tellurium palladium, germanium antimony tellurium cobalt, antimony tellurium bismuth selenium, silver indium antimony tellurium, germanium antimony selenium tellurium, germanium tin antimony tellurium, germanium tellurium tin nickel, germanium tellurium tin palladium, and germanium tellurium tin platinum. Among the phase change materials listed herein, some may provide an appropriate choice over the others, depending in part on the application of the device. For example, a compound of germanium (Ge), antimony (Sb), and telluride (Te) may be an appropriate choice for a phase change memory device, in part, because of its relatively quick switching speed (e.g., a few nanoseconds) between different resistance states. The compound of germanium (Ge), antimony (Sb), and telluride (Te) may have a formula $Ge_2Sb_5Te_5$. Most of the material compositions in this description list only the component elements. The relative amount of each component element in each of these material compositions is not limited to a particular value.

As shown in FIG. 6 through FIG. 9, memory element 666 may have portions 601 and 602 directly contact electrodes 651 and 652. FIG. 6 shows portion 602 being located at a general area indicated by a broken circle to indicate that portion 602 can be a part of portion 601 and can expand or contrast. Portion 602 can either occupy the entire volume of portion 601 or occupy only a smaller volume that is less than the entire volume of portion 601. Portion 602 may be referred to as a programmable portion (or programmable volume). A programming operation may program memory cell 600 to one of multiple possible resistance states 633, 733, 833, and 933 corresponding to one of resistance values (in ohm units) R0, R1, R2, and R3. The value of the information stored in memory element 666 can be based on which one of resistance values R0, R1, R2, and R3 memory element 666 may have after programming.

FIG. 6 shows an example where memory element 666 may have resistance value R0 in which the material at portions 601 and 602 has the same crystalline phase 613. A programming operation may program memory cell 600 to cause at least a part of portion 602 to "amorphize" (e.g., change from a crystalline phase to an amorphous phase), resulting in an amorphized region 713, 813, or 913, of FIG. 7, FIG. 8, and FIG. 9, respectively.

FIG. 7 through FIG. 9 show amorphized regions 713, 813, and 913 having different region sizes. For example, amorphized region 713 may have size smaller than that of amorphized region 813, and amorphized region 813 may have a size smaller than that of amorphized region 913. Different sizes of the amorphized region of portion 603 may cause memory cell 600 to have a different resistance value (e.g., R1, R2, or R3) to represent different values of information.

Figure 10:
FIG. 10 is a chart showing example resistance values and corresponding example resistance values of the memory element of FIG. 6 through FIG. 9, according to various embodiments of the invention.

FIG. 10 is a chart 1000 showing example resistance values R0, R1, R2, and R3 and corresponding example resistance values of memory element 666 of FIG. 6 through FIG. 9, according to various embodiments of the invention. Memory cell 600 can be configured to store information representing a value of multiple bits (e.g., two, three, four, or other bits). Chart 1000 of FIG. 10 shows an example relationship between resistance value and stored information value where each of four resistance values R0, R1, R2, and R3 can be assigned to a unique value of four possible values "00", "01", "10", and "11" of two bits. Chart 1000 can be stored in a unit of the memory device in different forms, such as firmware, hardware, or other forms.

During a programming operation, depending on what value of information is to be stored in a memory cell, one of resistance values R0, R1, R2, and R3 can be a target value. For example, if the information value to be stored in a memory cell is "01" (e.g., provided by a user or by another device), then the memory device may determine (e.g., based on chart 1000) that resistance value R1 would be a target resistance value during programming of that memory cell. In this example, the programming operation may apply a signal with one or more programming pulses to program the memory element until the programmed resistance value is within a target resistance value range of resistance value R1. Each of resistance values R0, R1, R2, and R3 can have a target resistance value range. This range can include a lower limit value equal to the target resistance value minus a lower offset value and an upper limit value equal to the target resistance value plus an upper offset value. The lower and upper offset values can be the same or can be different. The range of a target resistance value (e.g., the range of R2) does not overlap with the range of other neighbor target resistance values (e.g., the ranges of R1 and R3). Non-overlapping ranges allow each range to be unique, so that a unique value of information can correspond to each range.

FIG. 11 through FIG. 14 show a memory cell 1100 having a memory element 1111 and an access component 1143 arranged in a stack, according to various embodiments of the invention. Memory cell 1110 can be configured to have various resistance states 1133, 1233, 1333, and 1433 corresponding to various resistance values R0, R1, R2, and R3. As shown in FIG. 11 through FIG. 14, memory element 1111 is arranged in a stack with access component 1143 and an additional electrode 1153. Access component 1143 can include bipolar switching material or other switching material known to those skilled in the art.

The description herein includes ways to program a memory cell of a memory device, such as memory device 101 or 201 (FIG. 1 or FIG. 2), in which the memory device may include a memory cell with a memory element such as memory element 666 (FIG. 6 through FIG. 9) and memory element 1111 (FIG. 11 through FIG. 14).

The programming operation may include reset activities (occasionally called "reset" or "resetting") and set activities (occasionally called "set" or "setting"). The reset activities may change the memory cell to a resistance state in which the material of a programmable portion of the memory element may have one phase (e.g., an amorphous phase) and the material of the other portions of the memory element may have another phase (e.g., a crystalline phase).

For example, the reset activity may change memory cell 600 (FIG. 6) from resistance state 633 corresponding to resistance value R0 to a resistance state 733, 833, or 933 (FIG. 7 through FIG. 9) corresponding to one of resistance values R1, R2, or R3. Thus, each of resistance states 733, 833, and 933 may be called a "reset" resistance state. Each of resistance values R1, R2, and R3 may be called a "reset" resistance value. Similarly, the reset activity may change memory cell 1100 (FIG. 11) from resistance state 1133 corresponding to resistance value R0 to a resistance state 1233, 1333, or 1433 (FIG. 12 through FIG. 14) corresponding to one of resistance values R1, R2, or R3. Thus, each of resistance states 1233, 1333, and 1433 may be called a "reset" resistance state.

The set activities may change the memory cell from a reset resistance state to a "set" resistance state at which the material of memory element 666 (FIG. 6) or memory element 1111 (FIG. 11) may have the same phase (e.g., crystalline phase), such as a resistance state 633 (FIG. 6) or resistance state 1133 (FIG. 11) corresponding to resistance value R0. Thus, resistance state 633 or resistance state 1133 may be called a "set" resistance state. Resistance value R0 may be called a "set" resistance value.

The reset and set activities of the programming operations described herein may includes activities of the programming operations described below with reference to FIG. 15 through FIG. 20.

Figure 15:
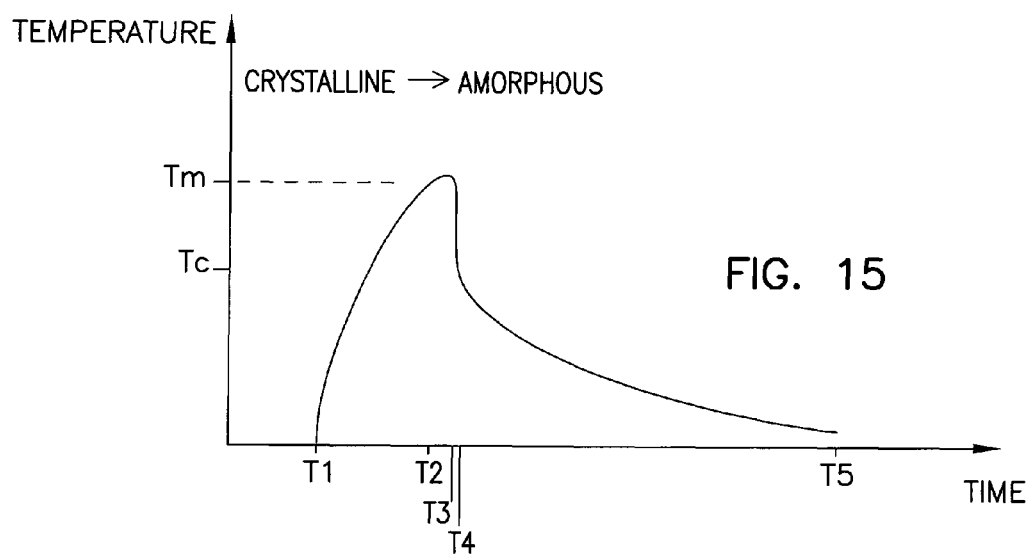
FIG. 15 is a graph of temperature versus time during a programming operation to reset a memory cell, according to an embodiment of the invention.

FIG. 15 is a graph of temperature versus time during a programming operation to reset a memory cell, such as one of memory cell 100, 200, 300, 400, 500, 600, and 1100 of FIG. 1 through FIG. 14, according to an embodiment of the invention. As shown in FIG. 6 through FIG. 9 and FIG. 11 through FIG. 14, resistance values R0, R1, R2, and R3 may depend on the characteristics of the material at the programmable portion (e.g., portion 602 or 1102) of the memory cell. For example, a different size of the amorphized region (e.g., 713, 813, or 913 of FIG. 7 through FIG. 9) may result in a different resistance value (e.g., R1, R2, or R3).

As shown in FIG. 15, at time T1 in a programming operation, the temperature of the material of the programmable portion of the memory cell may start to rise. A programming operation may apply a programming signal (e.g., a reset signal in FIG. 16) to heat the programmable portion and cause its temperature to rise.

From time T1 to time T2 in FIG. 15, the temperature of the heated material at the programmable portion rises and exceeds its crystalline temperature Tc. From time T2 to time T3, the heated material at the programmable portion may melt when it reaches its melting point temperature Tm.

From time T3 to time T4, the programming operation may allow the material to rapidly cool, such that its temperature may quickly decrease in a manner shown in FIG. 15.

From time T4 to time T5, the programming operation may cause the temperature of the programmable portion to remain at a relatively high temperature after the rapid cooling (after time T3). For example, the programming operation may cause the temperature of the programmable portion to remain at temperature of at least 200° C. at time T4 and gradually reduce it to a lower temperature (e.g., room temperature) at time T5. As shown in FIG. 4, the temperature at time T4 can be relatively high (e.g., 200° C. or higher) but can be lower than the crystalline temperature Tc.

After time T5, the material at the programmable portion may amorphize and become an amorphized region. The size of the amorphized region may depend on parameter values of a signal used during the programming operation. The signal may include one or more pulses. The parameter values can include an amplitude value of the pulse and values for various time intervals for different pulse segments of the pulse.

As is known to those skilled in the art, the reliability of memory devices with variable resistance memory elements (e.g., phase change memory element) can be related to the metastable nature of the amorphous phase in the material. After programming, the amorphized region the memory element may change over time by a so-called structure relaxation, resulting in long-term resistance drift of the memory element. For example, after programming, the resistance of the programmable portion may increase over time due to structure relaxation. Since the value of the information stored in the memory element is based on the value of the resistance of the memory element, the resistance drift may change the value of the information and degrade the reliability of the information.

In FIG. 15, maintaining the temperature of the programmable portion at a relatively high temperature (e.g., 200° C. or higher) at time T4 and allowing it to gradually decrease may accelerate the structure relaxation process and may reduce the long-term resistance drift after programming of the programmable portion. Thus, the reliability of the information stored in the memory element may be improved.

Figure 16:
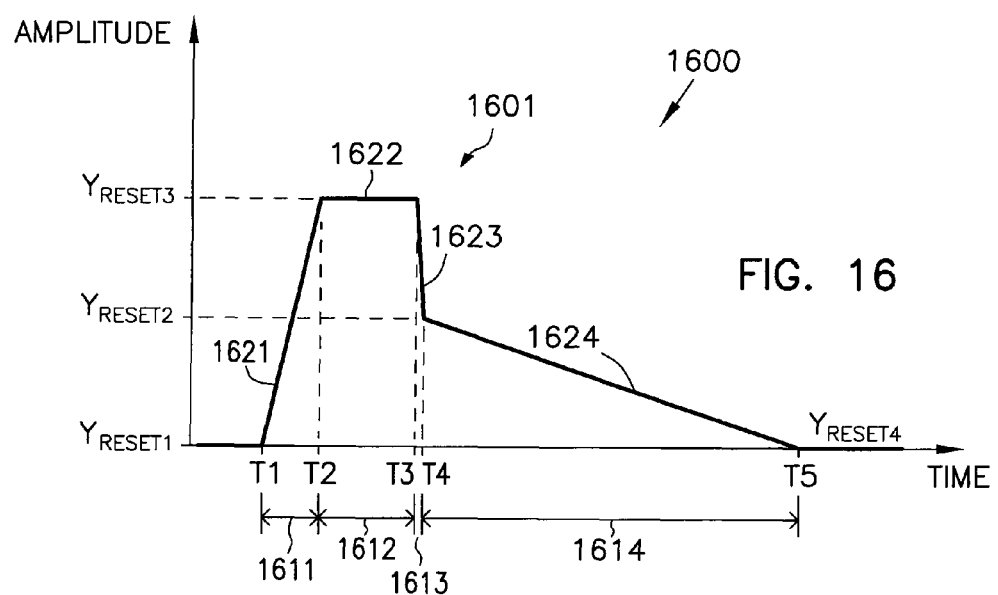
FIG. 16 is a graph of amplitude versus time of a signal that can be used during the programming operation associated with FIG. 15, according to an embodiment of the invention.

FIG. 16 is a graph of amplitude versus time of a signal that can be used during the programming operation described above with reference to FIG. 15, according to an embodiment of the invention. FIG. 16 shows signal 1600 having a single pulse 1601 as an example. Signal 1600 may include multiple pulses during a programming of a memory cell. The multiple pulses can have the different amplitude values.

Amplitude values $Y_{RESET1}$, $Y_{RESET2}$, $Y_{RESET3}$, and $Y_{RESET4}$ correspond to different values of the amplitude of pulse 1601 with $Y_{RESET3}$ being the greatest value. Amplitude values $Y_{RESET3}$ can also be called the peak amplitude value of pulse 1601. Amplitude values $Y_{RESET1}$ and $Y_{RESET4}$ can be the same and can include zero. Signal 1600 can include a voltage signal or a current signal. Thus, amplitude values $Y_{RESET1}$, $Y_{RESET2}$, $Y_{RESET3}$, and $Y_{RESET4}$ can be voltage or current values. Different amplitude values of $Y_{RESET3}$ can cause a programmable portion of a memory cell to amorphize to different amorphized regions with different sizes corresponding to different resistance values (e.g., R1, R2, and R3). For example, one value of $Y_{RESET3}$ can cause the memory cell to have one resistance value (e.g., R1) and another value of one value of $Y_{RESET3}$ can cause the memory cell to have another resistance value (e.g., R2).

As shown in FIG. 16, pulse 1601 has a non-square shape and has multiple pulse segments with different slopes at different time intervals. For example, at time interval 1611 (from time T1 to time T2), pulse 1601 has a pulse segment 1621 with a positive slope. At time interval 1612 (from time T2 and to time T3), pulse 1601 has pulse segment 1622 with slope of approximately zero (e.g., substantially flat). At time interval 1613 (from time T3 to time T4), pulse 1601 has a pulse segment 1623 with a negative slope. At time interval 1614 (from time T4 to time T5), pulse 1601 has a pulse segment 1624 with another negative slope.

The slope of pulse segment 1623 can be substantially greater (e.g., steeper) than the slope of pulse segment 1624. The absolute value of the slope of pulse segment 1623 can be greater than the absolute value of the slope of each of pulse segment 1621 and pulse segment 1622. The absolute value of pulse segment 1622 can be less than the absolute value of each of pulse segment 1621 and pulse segment 1623. The absolute value of the slope of pulse segment 1624 can be less than the absolute value of each of pulse segment 1621 and pulse segment 1622.

During a programming operation, at an appropriate amplitude value of $Y_{RESET3}$, time interval 1611 can be at sufficient value to heat the programmable portion (e.g., 602 in FIG. 6 or 1102 in FIG. 11) such that the material of the heated programmable portion can reach at least its melting point temperature Tm. For example, when the material of the programmable portion includes a phase change material, time interval 1611 can have value in the range of 10 nanoseconds (ns) to 20 ns. Other ranges can be used.

Time interval 1612 can be at a sufficient value to allow the material of the programmable portion to change from one phase to another phase, such as from a crystalline phase to an amorphous phase for a phase change material. For example, time interval 1612 can have a value the range of 30 ns to 50 ns. Other ranges can be used.

After the programmable portion reaches its melting point temperature Tm for a time interval 1612, the programming operation may quickly decrease the value of the amplitude of pulse 1601 to allow rapid cooling (sometimes referred to as quick quenching) of the programmable portion. As shown in FIG. 16, the amplitude of pulse 1601 can be decreased from amplitude value $Y_{RESET3}$ at time T3 to amplitude value $Y_{RESET2}$ at time T4 in a relatively small time interval 1613. Time interval 1613 can be at least five times less than time interval 1612. For example, time interval 1613 can have a value in the range of a fraction of one nanosecond (e.g., near zero) to 5 ns. Other ranges can be used.

Pulse segment 1624 at time interval 1614 in FIG. 16 can maintain the temperature of at least a portion (e.g., programmable portion) of the memory element at a relatively high temperature (e.g., 200° C. or higher) at time T4 and gradually decrease it to a lower temperature (e.g., room temperature) at the end of the programming of the memory cell (e.g., at time T5). The rate at which pulse segment 1624 decreases the temperature of the portion (e.g., programmable portion) of the memory element can be lower than the rate at which pulse segment 1623 decreases the temperature of the portion of the memory element.

As is known to those skilled in the art, after programming, the programmed resistance value (e.g., R1, R2, or R3 in FIG. 6 through FIG. 9) may change over time. Thus, the value of the information corresponding to the programmed resistance value may no longer reflect the original value of the stored information. As described above with reference to FIG. 15, the change in resistance value can be attributed in part to a resistance drift due to structure relaxation in the material of the memory element during and after programming of the memory element. The structure relaxation involves a change in the properties of the material over time. Applying a signal, such as signal 1600 in FIG. 16, may accelerate the structure relaxation by causing the structure relaxation to occur mostly during programming (e.g., occur between times T4 and T5). Thus, after programming (e.g., after time T5), the structure relaxation can be reduced, thereby reducing the resistance drift after programming. A reduction in the resistance drift after programming may allow the programmed resistance value (e.g., R1, R2, or R3) to remain unchanged or to stay at a relative constant value, thereby improving the reliability of the information stored in the memory element and potentially reducing the process of error-correction of the stored information.

As shown in FIG. 16, instead of quickly decreasing the amplitude of pulse 1601 from amplitude value $Y_{RESET2}$ at time T3 to amplitude value $Y_{RESET4}$ (which can be equal to $Y_{RESET1}$) at some time before time T5 (e.g., time T4), signal 1600 may gradually decrease the amplitude of pulse 1601 from amplitude value $Y_{RESET2}$ at time T4 to amplitude value $Y_{RESET4}$ at time T5. Time interval 1614 can be at least ten times greater than time interval 1613. Time interval 1614 can also be at least two times greater than time interval 1611. For example, time interval 1614 can have value in the range of 50 ns to 200 ns.

The gradual decrease in the pulse amplitude value during time interval 1614 (from time T4 to time T5) can cause the temperature of a programmable portion of a memory element to gradually decrease from a higher temperature (e.g., 200° C.) at time T4 to a lower temperature (e.g. room temperature) at time T5. The gradually decrease in the temperature resulted from the pulse amplitude value being gradually decreased can accelerate the structure relaxation process to improve the reliability of the information stored in the memory element.

The acceleration of the structure relaxation may be dependent on temperature, such as inversely proportional to temperature. As described above with reference to FIG. 15, maintaining the temperature of at least a portion of the memory element at a relatively high temperature (e.g., 200° C. or higher) right after cooling may accelerate the structure relaxation. A higher temperature may lead to a shorter structure relaxation time. A lower temperature may lead to a longer structure relaxation time. In some cases, the structure relaxation time can be approximately tens of nanoseconds when the temperature of the programmable portion of memory element is approximately 200° C. (or higher) at time T4.

The temperature that can be maintained at a time after cooling (e.g., at time T4) can be proportional to the amplitude value (e.g., $Y_{RESET2}$ in FIG. 16) of the pulse at that time (e.g., at time T4). For example, a relatively higher amplitude value of $Y_{RESET2}$ at time T4 can maintain the temperature at time T4 at a higher temperature (e.g., 210° C.). A relatively lower amplitude value of $Y_{RESET2}$ at time T4 can maintain the temperature at time T4 at a lower temperature (e.g., 200° C.). As described above, a higher temperature may lead to a shorter structure relaxation time. Thus, a higher temperature at time T4 due to a higher amplitude value of $Y_{RESET2}$ at time T4 can shorten the structure relaxation time and time interval 1614, leading to a reduction in the overall programming time. For example, at an appropriate amplitude value of $Y_{RESET2}$, the programming time can be less than 100 ns.

Amplitude value $Y_{RESET2}$ in FIG. 16 depends on amplitude value $Y_{RESET3}$ (e.g., amplitude value before rapid cooling). Amplitude value $Y_{RESET3}$ can be related to dimensions and material properties of the memory cell. For example, amplitude value $Y_{RESET3}$ can be at least one and a half (1.5) times greater than amplitude value $Y_{RESET2}$. In some cases, when a memory cell having a phase change memory element and an electrode (e.g., electrode 651 in FIG. 6) with a diameter of approximately 35 nm, amplitude value $Y_{RESET2}$ can be approximately 2.2 volts and amplitude value $Y_{RESET3}$ can be approximately 3.5 volts, where 3.5 volts can be the peak voltage of signal 1600 during time interval 1612 (e.g., before the rapid cooling during time interval 1613).

The values of the amplitudes (e.g., $Y_{RESET1}$, $Y_{RESET2}$, $Y_{RESET3}$, and $Y_{RESET4}$) and the values of time intervals (e.g., 1611, 1612, 1613, and 1614) can be stored in form of a table, such as table 155 in FIG. 1, of a memory device. Alternatively or in addition, these values can also be generated by hard wired circuit elements included in the memory device. These circuit elements may include adjustable circuit elements to appropriately adjust the values of the amplitudes, time intervals, or both. Examples of the adjustable circuit elements include fuses and antifuses. The amplitude values, time values, or both can be selected by appropriate arranging connections (e.g., during manufacturing) of such fuses or antifuses.

Accelerated structure relaxation as described above can improve (e.g., by broadening) the switch window of the memory cell. The switch window refers to a window when the memory cell switches between "reset" resistance state with maximum resistance value and "set" resistance state with minimum resistance value. For example, as is known to those skilled in the art, the programmed resistance value and the threshold voltage value of the memory cell have a linear relationship. An increase in a programmed resistance value leads to an increase threshold voltage value. The accelerated structure relaxation may increase the programmed resistance value in the "reset" resistance state. Thus, the threshold voltage value in the "reset" resistance state also may also increase, thereby broadening the switch window of the memory cell. Further, an increase in the switch window, due to the threshold voltage value in the "reset" resistance state being increased, may not affect read signals (e.g., voltage or current) used to read the memory during a read operation. Thus, adjustments to components (e.g., read circuitry) of the memory device may be avoided.

Some phase change memory devices, (e.g., Ovonic Threshold Switch (OTS) or others) may estimate design calculation based on a threshold voltage associated with the programmed resistance value of the memory cell. Without the accelerated structure relaxation described above, the design latitude may be suitable right after programming because the threshold voltage most likely remains stable due to the programmed resistance value remaining unchanged right after the programming. However, the programmed resistance value may drift (e.g., change to a higher value) over time. Thus, the design latitude may be invalid. Using a programming operation with the accelerated structure relaxation described above, the programmed resistance value may remain relatively unchanged over time. Therefore, threshold voltage associated with the programmed resistance value may remain relatively unchanged over time. Thus, when the threshold voltage in the programming operation with accelerated structure relaxation is used in the design calculation in some memory devices, overestimation of the design calculation may be avoided.

The description above with respect to FIG. 15 and FIG. 16 refers to a programming operation to reset a memory cell, such as to program the memory element to a particular resistance value (e.g., R1, R2, or R3). The programming operation may also set the memory element, such as to program the memory element to an initial resistance value (e.g., R0).

Figure 17:
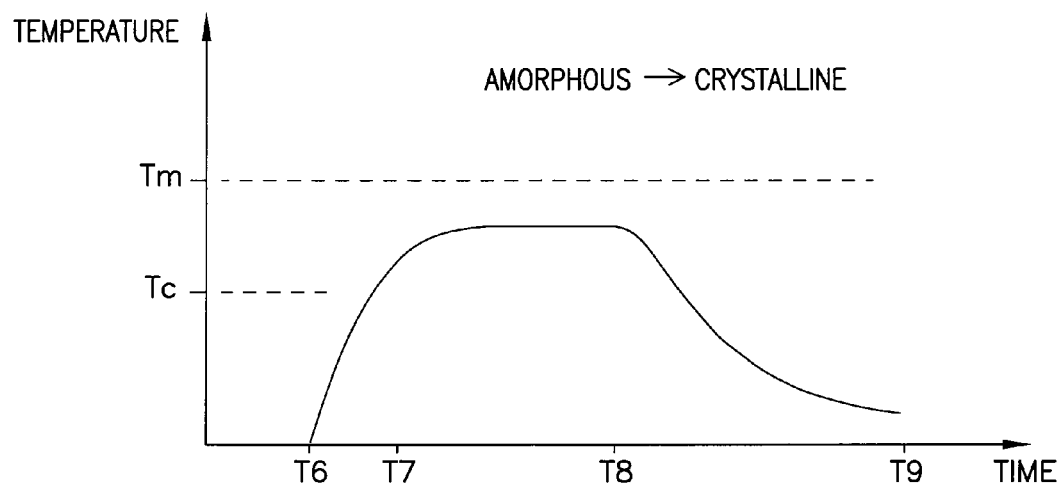
FIG. 17 is a graph of temperature versus time during a programming operation to set a memory element of a memory cell, according to an embodiment of the invention.

FIG. 17 is a graph of temperature versus time during a programming operation to set a memory element of a memory cell, such as the memory cells 100, 200, 300, 400, 500, 600, and 1100 of FIG. 1 through FIG. 14, according to an embodiment of the invention.

As shown in FIG. 17, at time T6 in a programming operation, the temperature of the material of the programmable portion of the memory cell may start to rise. A programming operation may apply a programming signal (e.g., a set signal in FIG. 18) to heat the programmable portion and cause its temperature to rise.

From time T6 to time T7, the temperature of the heated material at the programmable portion rises and exceeds its crystalline temperature Tc but stays below its melting point temperature Tm.

From time T7 to time T8, the programming operation may cause the material at the programmable portion to remain at a relatively constant temperature.

From time T7 to time T8, the programming operation may allow the temperature of material at the programmable portion to decrease. As a result, the programmable portion may "recrystallize" (e.g., change from an amorphous phase to a crystalline phase) such that the material of the programmable portion and other portions (e.g., portions 602 and 601 in FIG. 7 through FIG. 9) may have the same phase. After time T9, the memory cell may have a resistance value (e.g., resistance value R0 in FIG. 6) corresponding to a crystalline phase of the material.

Figure 18:
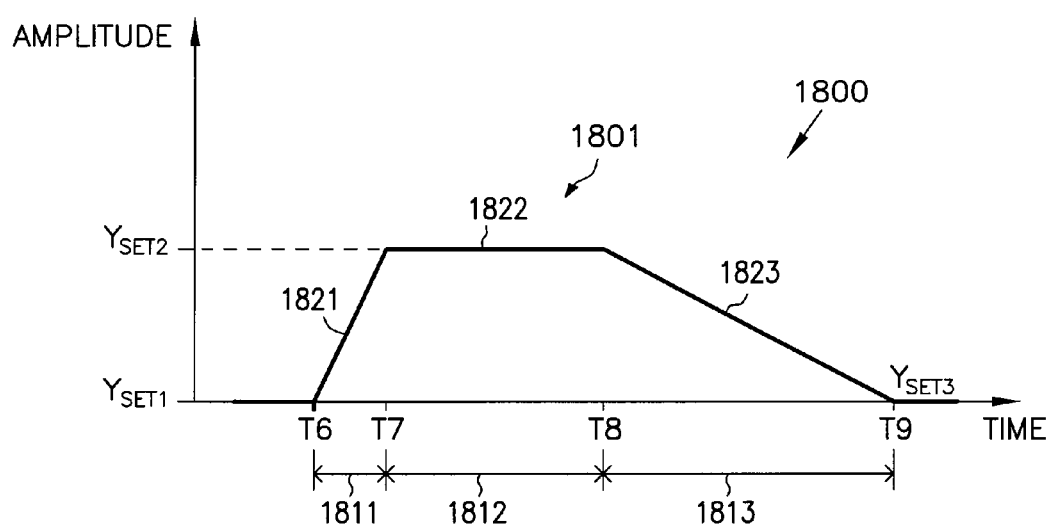
FIG. 18 is a graph of amplitude versus time of a signal that can be used during the programming operation associated with FIG. 17, according to an embodiment of the invention.

FIG. 18 is a graph of amplitude versus time of signal 1800 that can be used during the programming operation associated with FIG. 17, according to an embodiment of the invention. FIG. 18 shows signal 1800 having a single pulse 1801 as an example. Signal 1800 may include multiple pulses during a programming of a memory cell. The multiple pulses can have the same amplitude value.

Amplitude values $Y_{SET1}$, $Y_{SET2}$, and $Y_{SET3}$ correspond to different values of the amplitude of pulse 1801. Amplitude values $Y_{SET1}$ and $Y_{SET3}$ can be the same and can include zero. Signal 1800 can include a voltage signal or a current signal. Thus, amplitude values $Y_{SET1}$, $Y_{SET2}$, and $Y_{SET3}$ can be voltage or current values.

As shown in FIG. 18, pulse 1801 has a non-square shape and has multiple pulse segments with different slopes at different time intervals. For example, at time interval 1811 (from time T6 to time T7), pulse 1801 has a pulse segment 1821 with a positive slope. At time interval 1812 (from time T7 to time T8), pulse 1801 has pulse segment 1822 with a slope of approximate zero (e.g., substantially flat). At time interval 1813 (from time T8 to time T9), pulse 1801 has a pulse segment 1823 with a negative slope.

As shown in FIG. 18, the absolute value of the slope of pulse segment 1821 can be greater than the absolute value of the slope of each of pulse segment 1822 and pulse segment 1823.

During a programming operation, with an appropriate amplitude value of $Y_{SET2}$, time interval 1811 can be at sufficient value to allow heating of the programmable portion (e.g., 601 in FIG. 6 or 1102 in FIG. 11) such that the temperature of the material of the heated programmable portion can rise above crystalline temperature Tc but stay below its melting point temperature Tm. For example, time interval 1811 can have value in the range of 10 ns to 20 ns.

With an appropriate amplitude value of $Y_{SET2}$, time interval 1812 can be at a sufficient value to allow the material of the programmable portion to change from one phase to another phase, such as from an amorphous phase to a crystalline phase for a phase change material. For example, time interval 1812 can have a value the range of 50 ns to 100 ns.

After the programmable portion reaches its melting crystalline temperature Tc for time interval 1812, the programming operation may gradually decrease the value of the amplitude of pulse 1801 to allow the temperature of the programmable portion to gradually decrease. As shown in FIG. 18, the amplitude of pulse 1801 can be gradually decreased from amplitude value $Y_{SET2}$ to amplitude value $Y_{SET3}$. The time interval 1813 can be relatively large. For example, time interval 1813 can have a value in the range of 100 ns 150 ns.

The values of the amplitudes (e.g., $Y_{SET1}$, $Y_{SET2}$, and $Y_{SET3}$) and the values of time intervals (e.g., 1811, 1812, and 1813) can be stored in form of a table, such as table 155 in FIG. 1, of a memory device. Alteratively or in addition, these values can also be generated by hard wired circuit elements included in the memory device. These circuit elements may include adjustable circuit elements to appropriately adjust the values of the amplitudes, time intervals, or both. Examples of the adjustable circuit elements include fuses and antifuses. The amplitude values, time values, or both can be selected by appropriate arranging connections (e.g., during manufacturing) of such fuses or antifuses.

Figure 19:
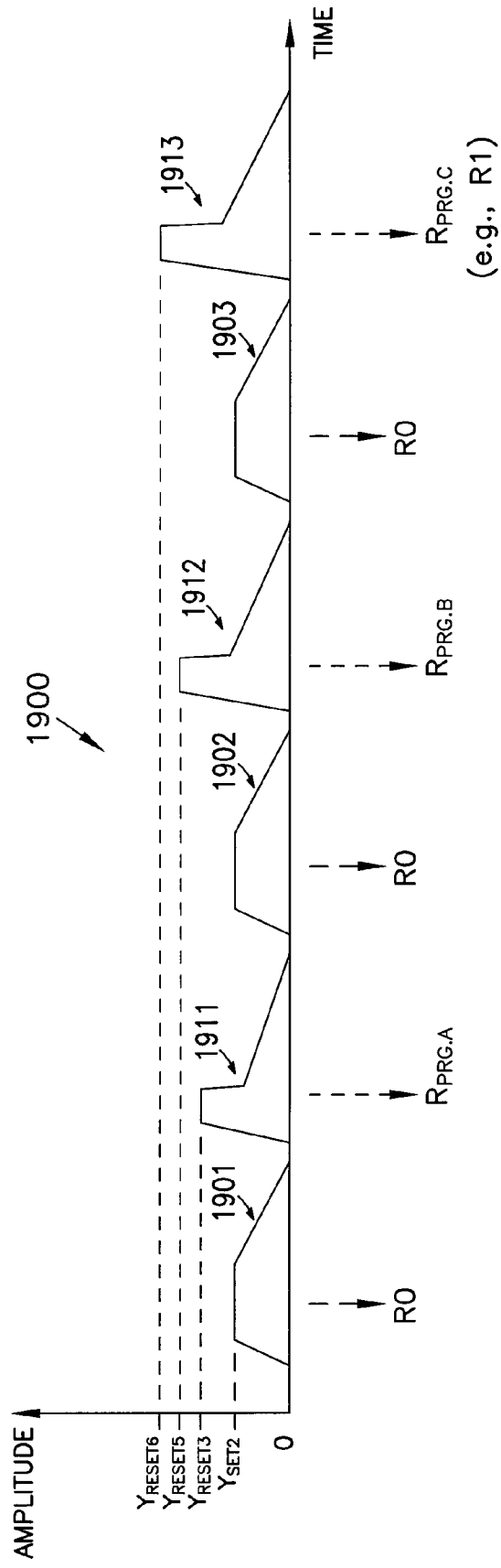
FIG. 19 is a graph showing a signal having multiple pulses used during a programming operation, according to an embodiment of the invention.

FIG. 19 is a graph showing a signal 1900 having multiple pulses used during a programming operation, according to an embodiment of the invention. Signal 1900 can include pulses 1901, 1902, and 1903, which have a pulse shape similar to the non-square shape of pulse 1801 in FIG. 18. Signal 1900 in FIG. 19 can also include pulses 1911, 1912, and 1913, which have a pulse shape similar to the non-square shape of pulse 1601 in FIG. 16. As shown in FIG. 19, signal 1900 has different amplitude values $Y_{SET2}$, $Y_{RESET3}$, $Y_{RESET5}$, and $Y_{RESET6}$ corresponding their respective pulses. Amplitude values $Y_{RESET3}$, $Y_{RESET5}$, and $Y_{RESET6}$ can be peak amplitude values of pulses 1911, 1912, and 1913, respectively. A programming operation may apply (e.g., serially apply) some or all of these pulses of signal 1900 to program a memory cell until a programmed resistance value in that memory cell is within a target resistance value range of a corresponding target resistance value (e.g., R1, R2, or R3 in FIG. 6 through FIG. 14).

In the description with reference to FIG. 19, resistance value R1 is used as an example target resistance value to be programmed into a memory cell. $R_{PRG.A}$, $R_{PRG.B}$, and $R_{PRG.C}$ in FIG. 19 represent various programmed resistance values measured from the memory cell after one or more pulses of signal applied during the programming operation. In this example, programmed resistance value $R_{PRG.C}$ is the only programmed resistance value that is within the target resistance value range. Each of the programmed resistance values $R_{PRG.A}$ and $R_{PRG.B}$ is outside the target resistance value range. During a programming operation, if the measured programmed resistance value ($R_{PRG.A}$ or $R_{PRG.B}$) is outside a target resistance value range, the programming operation may continue (e.g., with one or more different pulses) until the measured programmed resistance value ($R_{PRG.C}$) is within the target resistance value. The programming operation may stop programming the memory cell when the measured programmed resistance value in the memory cell is within the target resistance value range.

As shown in FIG. 19, the programming operation may initially apply pulse 1901 to program (e.g., set) the memory cell to an initial resistance value R0. Then, the programming operation may apply pulse 1911 to program (e.g., reset) the memory cell to programmed resistance value $R_{PRG.A}$. After determining that programmed resistance value $R_{PRG.A}$ is outside the target resistance value range, the programming operation may repeat the programming with one or more of pulses 1902, 1912, 1903, and 1913. Determining whether a programmed resistance value is within a target resistance value range can include measuring the programmed resistance value and comparing it with a lower limit value and an upper limit value of the target resistance value range. The comparison can include determining a condition of whether the programmed resistance value is at least equal to the lower limit value and, at most, equal to the upper limit value. If this condition is unsatisfied, the programming operation may repeat the programming until the condition is satisfied, such that the programmed resistance value (e.g., $R_{PRG.C}$) is within the target resistance value range.

As shown in FIG. 19, pulses 1911, 1912, and 1913 can have amplitudes with different values $Y_{RESET3}$, $Y_{RESET5}$, and $Y_{RESET6}$. The different amplitudes values may allow the programming operation to change from one programmed resistance value to a different resistance value after each of pulses 1911, 1912, and 1913, so that the programmed resistance value can eventually be within the target resistance value range.

The programming operation may use pulses 1901, 1902, and 1903 to program (e.g., set) the memory cell to an initial resistance value (e.g., R0) before each time that the programming operation programs (e.g., resets) the memory cell to a programmed resistance value $R_{PRG.A}$, $R_{PRG.B}$ or $R_{PRG.C}$. Pulses 1901, 1902, and 1903 can have an amplitude with the same amplitude value (e.g., $Y_{SET2}$) and it can remain unchanged (e.g., at $Y_{SET2}$) each time programming the memory cell is repeated. Using pulse 1901, 1902, or 1903 to set the memory cell before the memory cell is reset each time may allow the memory cell to have a consistent initial resistance value (e.g., R0) to improve the programming operation.

Figure 20:
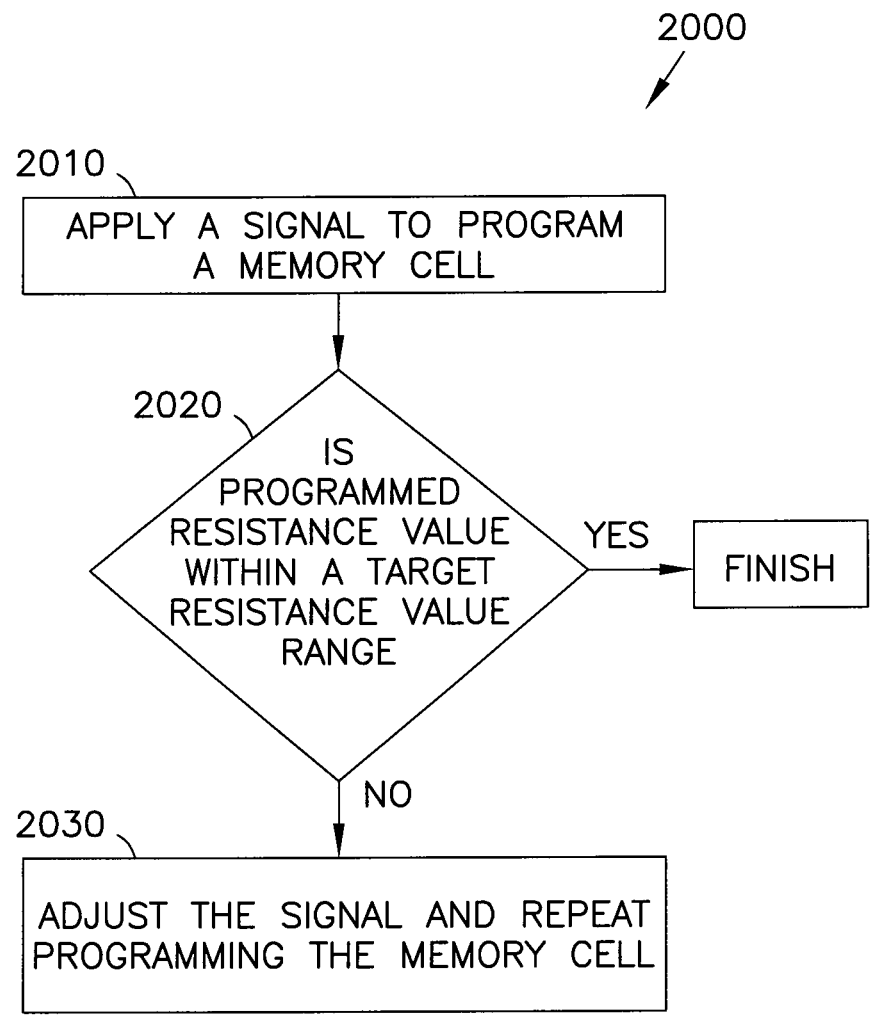
FIG. 20 is a flow diagram showing methods of programming a memory device, according to an embodiment of the invention.

FIG. 20 shows a flow diagram for a method 2000 of programming a memory device, according to an embodiment of the invention. Method 2000 can be used to program the memory cells described above with reference to FIG. 2 through FIG. 19. Thus, method 2000 can include activities and programming operations described above with reference to FIG. 2 through FIG. 19.

Method 2000 can include activities 2010, 2020, and 2030 during programming a memory cell. Activity 2010 may apply a signal to program a memory cell. The signal may include signal 1900 of FIG. 19. Activity 2020 of method 2000 may determine whether a programmed resistance value of the memory cell is within a target resistance value range. If the programmed resistance value is within the target resistance value range (indicated by "YES" in FIG. 20), method 2000 may stop programming the memory cell, and the programming of that memory cell is finished. If the programmed resistance value is outside the target resistance value range (indicated by "NO" in FIG. 20), method 2000 may continue with activity 2030.

Activity 2030 may adjust the signal and continue programming the memory cell until the programmed resistance value of the memory cell is within the target resistance value range. Activity 2030 may adjust the signal by changing the value of the amplitude of a pulse of the signal. Method 2000 can include additional activities and programming operations described above with reference to FIG. 2 through FIG. 19.

The illustrations of apparatus (e.g., memory device 100 of FIG. 1 and memory cells of FIG. 2 through FIG. 14) are intended to provide a general understanding of the structure of various embodiments and are not intended to provide a complete description of all the elements and features of apparatus or systems that might make use of the structures described herein.

Any of the components described above can be implemented in a number of ways, including simulation via software. Thus, the apparatus (e.g., memory device 100 and its components) described above may all be characterized as "modules" (or "module") herein. Such modules may include or be included in hardware circuitry, single and/or multi-processor circuits, memory circuits, software program modules and objects and/or firmware, and combinations thereof, as desired by the architect of the apparatus (e.g., memory device 100) and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to operate or simulate the operation of various potential embodiments.

The apparatus of various embodiments may include or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus may further be included as subcomponents within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 20 include a device having memory elements and methods of storing information into the memory elements. Such methods can include increasing a temperature of a portion of a memory element for a time interval during an operation to change a resistance state of the memory element. After the time interval, the methods can include decreasing the temperature of the portion of the memory element. Decreasing the temperature can be performed using a signal having a first negative slope and a second negative slope. Other embodiments are described above with reference to FIG. 1 through FIG. 20.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. A method comprising:
    increasing a temperature of a portion of a memory element for a time interval during an operation to change a resistance state of the memory element;
    decreasing the temperature of the portion of the memory element after the time interval, wherein decreasing the temperature is performed using a signal having a first negative slope and a second negative slope; and
    repeating the increasing and decreasing the temperatures the portion of the memory element if the resistance state of the memory element is outside a target resistance value range, wherein the signal has a different amplitude value if the increasing and decreasing the temperatures is repeated.

2. The method of claim 1, wherein increasing the temperature and decreasing the temperature is performed using a single pulse of the signal.

3. The method of claim 2, wherein the single pulse includes a first pulse segment with a positive slope, a second pulse segment with the first negative slope, and a third pulse segment with the second negative slope, and wherein increasing the temperature is performed during a time interval associated with the first pulse segment.

4. The method of claim 1, wherein the first negative slope is greater than the second negative slope.

5. The method of claim 1, wherein the first negative slope is associated with a first time interval during the operation, the second negative slope is associated with a second time interval during the operation, and the second time interval is at least ten times greater than the first time interval.

6. The method of claim 5, wherein the second time interval has a range of 50 nanoseconds to 200 nanoseconds.

7. The method of claim 1, wherein decreasing the temperature of the portion of the memory element is performed after a material of the portion of the memory element reaches a melting point temperature of the material.

8. The method of claim 1, wherein the first negative slope occurs when the temperature of the portion of the memory element is at least 200° C.

9. A method comprising:
    increasing a temperature of a portion of a memory element during an operation to change a resistance state of the memory element;
    decreasing the temperature, at a first rate, to a temperature below a melting point temperature of a material of the portion of the memory element after the temperature reaches a melting point temperature of the material;
    decreasing the temperature a second rate lower than the first rate to accelerate structure relaxation of the memory element; and
    repeating the increasing and decreasing the temperatures of the portion of a memory element if the resistance state of the memory element is outside a target resistance value range, wherein the signal has a different amplitude value if the increasing and decreasing the temperatures is repeated.

10. The method of claim 9, wherein decreasing the temperature at the first rate is performed during a first segment of a pulse, and decreasing the temperature at the second rate is performed during a second segment of the pulse.

11. The method of claim 9, wherein increasing the temperature is performed during a first time interval that is at least two times less than a time interval when the temperature is decreased at the second rate.

12. A method comprising:
changing a first amplitude value of a first pulse of a signal to a second amplitude value in a first time interval during an operation to store information into a memory cell;
changing the second amplitude value to a third amplitude value in a second time interval during the operation;
changing the third amplitude value to a fourth amplitude value in a third time interval during the operation, wherein the signal has a first slope during the second time interval and a second slope during the third time interval, and the second slope is different from the first slope and
repeating the operation to store information into the memory cell using a second pulse of the signal if a resistance value of the memory cell is outside a target resistance value range after the first, second, and third amplitudes of the first pulse are changed, wherein the first and second pulses have different amplitude values.

13. The method of claim 12, wherein the second amplitude value is greater than each of the first amplitude value and third amplitude value.

14. The method of claim 12, wherein the second amplitude value is at least one and a half times greater than the third amplitude value.

15. The method of claim 12, wherein the first amplitude value is equal to the fourth amplitude value.

16. The method of claim 15, wherein the first amplitude value is zero.

17. A method comprising:
programming a memory cell using a pulse to cause the memory cell to have a programmed resistance value, the pulse including multiple negative slopes; and
repeating the programming if the programmed resistance value is outside a target resistance value range, wherein the pulse has a different amplitude value each time the programming is repeated.

18. The method of claim 17, wherein programming the memory cell further includes:
using an additional pulse to cause the memory cell to have an initial resistance value different from the programmed resistance value.

19. The method of claim 17, wherein repeating the programming further includes using an additional pulse in addition to the pulse used to cause the memory cell to have the programmed resistance value, wherein the additional pulse includes an amplitude value less than the amplitude value of the pulse used to cause the memory cell to have the programmed resistance value.

20. The method of claim 19, wherein an amplitude value of the additional pulse remains unchanged each time the programming is repeated.

21. A memory device comprising:
a memory element; and
a module to apply a signal to change a state of the memory element, the signal including a pulse, the pulse having a first pulse segment with a positive slope, a second pulse segment with a first negative slope, and a third pulse segment with a second negative slope, the module further to apply an additional pulse of the signal to change the state of the memory element if a resistance value of the memory element is outside a target resistance value range after the pulse is applied, wherein the pulse and the additional pulse have different amplitude values.

22. The memory device of claim 21, wherein an absolute value of the first negative slope is greater than an absolute value of the second negative slope.

23. The memory device of claim 22, wherein the absolute value of the second negative slope is less than an absolute value of the positive slope.

24. The memory device of claim 21, wherein the pulse includes an additional pulse segment between the first pulse segment and the second pulse segment.

25. The memory device of claim 24, wherein an absolute value of the additional pulse segment is less than an absolute value of each of the first pulse segment and the second pulse segment.

26. The memory device of claim 21, wherein the resistance value includes a resistance value of a material of the memory element.

27. The memory device of claim 21, wherein the memory element includes a phase change material.

28. A memory device comprising:
a memory element having a material; and
a module to apply a pulse to store information into the memory element, the module to increase an amplitude value of the pulse from a first amplitude value to a second amplitude value during a heating of the memory element, to decrease the second amplitude value to a third amplitude value during a cooling of the memory element, and to decrease the third amplitude value to a fourth amplitude after the cooling of the memory element, the module further to apply an additional pulse if a resistance value of the memory element is outside a target resistance value range after the pulse is applied, wherein the pulse and the additional pulse have different amplitude values.

29. The memory device of claim 28, wherein the second amplitude value has a range of approximately 3 volts to approximately 4 volts.

30. The memory device of claim 29, wherein the third amplitude value has a range of approximately 2 volts to approximately 2.5 volts.

31. The memory device of claim 30, wherein the memory element is coupled to an electrode and the electrode has a cylindrical shape.

32. The memory device of claim 28, further comprising an access component arranged in a stack arrangement with the memory element.

33. The memory device of claim 32, further comprising an electrode between the memory element and the access component.

* * * * *

UNITED STATES PATENT AND TRADEMARK OFFICE
CERTIFICATE OF CORRECTION

PATENT NO. : 8,446,758 B2  
APPLICATION NO. : 12/967592  
DATED : May 21, 2013  
INVENTOR(S) : Xiaonan Chen Page 1 of 1

It is certified that error appears in the above-identified patent and that said Letters Patent is hereby corrected as shown below:

In the Claims:

In column 17, line 23, in Claim 12, delete "slope" and insert -- slope; --, therefor.

Signed and Sealed this  
Sixteenth Day of July, 2013

Teresa Stanek Rea  
*Acting Director of the United States Patent and Trademark Office*